US009786978B2

(12) United States Patent

Zhang et al.

(10) Patent No.: US 9,786,978 B2

(45) Date of Patent: Oct. 10, 2017

(54) LTCC BALUN FILTER USING TWO OUT-OF-PHASE FILTERING CIRCUITS

(71) Applicant: South China University of Technology, Guangzhou (CN)

(72) Inventors: Xiuyin Zhang, Guangzhou (CN); Xiaofeng Liu, Guangzhou (CN); Jinxu Xu, Guangzhou (CN); Xiaolan Zhao, Guangzhou (CN)

(73) Assignee: South China University of Technology (CN)

( * ) Notice: Subject to any disclaimer, the term of this patent is extended or adjusted under 35 U.S.C. 154(b) by 0 days.

(21) Appl. No.: 15/027,370

(22) PCT Filed: Dec. 4, 2014

(86) PCT No.: PCT/CN2014/092999

§ 371 (c)(1),
(2) Date: Apr. 5, 2016

(87) PCT Pub. No.: WO2016/033890

PCT Pub. Date: Mar. 10, 2016

(65) Prior Publication Data

US 2016/0248140 A1 Aug. 25, 2016

(30) Foreign Application Priority Data

Sep. 3, 2014 (CN) .......................... 2014 1 0446156

(51) Int. Cl.

*H01P 5/10* (2006.01)
*H01P 1/203* (2006.01)
*H03H 7/42* (2006.01)

(52) U.S. Cl.

CPC ................ *H01P 5/10* (2013.01); *H01P 1/203* (2013.01); *H01P 1/20345* (2013.01)

(58) Field of Classification Search

CPC .................................... H03H 7/42; H01P 5/10

(Continued)

(56) References Cited

U.S. PATENT DOCUMENTS

| | | | | |
|---|---|---|---|---|
| 7,157,986 B1 * | 1/2007 | Wu | H01P 5/10 333/116 |
| 7,176,776 B1 * | 2/2007 | Tantwai | H01P 1/2135 333/204 |

(Continued)

FOREIGN PATENT DOCUMENTS

| | | | |
|---|---|---|---|
| CN | 200956398 Y | 10/2007 |
| CN | 201430202 Y | 3/2010 |

(Continued)

OTHER PUBLICATIONS

Inernational Search Report for Application No. PCT/CN2014/092999 dated May 15, 2015.

*Primary Examiner* — Dean Takaoka

(74) *Attorney, Agent, or Firm* — Lerner, David, Littenberg, Krumholz & Mentlik, LLP

(57) ABSTRACT

The invention presents a LTCC balun filter using two out-of-phase filtering circuits. The LTCC balun filter is comprised of three half-wavelength resonators and grounds which are located on fourteen metal layers. Vias are utilized to connect different metal parts. The first, fourth, seventh, eleventh and fourteenth metal layers are the ground. The three half-wavelength resonators are on the second, third, fifth, sixth, eighth, ninth, tenth, twelfth and thirteenth metal layers. By adjusting the coupling parts of the three half-wavelength resonators, namely the lengths of the seventh, eighth, ninth, tenth and eleventh layers, as well as the distances between them, the coupling strength between the half-wavelength resonators can be tuned. In addition, the quality factor of the circuit can be improved by tuning the port positions. By using the multi-layer LTCC technology, (Continued)

the present invention has the advantage of compact size, novelty, creativity and practicability.

5 Claims, 9 Drawing Sheets

(58) Field of Classification Search
USPC ........................................................ 333/25, 26
See application file for complete search history.

(56) References Cited

U.S. PATENT DOCUMENTS

| | | | | |
|---|---|---|---|---|
| 7,183,872 | B2 * | 2/2007 | Lee | H01P 5/10 333/25 |
| 7,236,064 | B2 * | 6/2007 | Lee | H01P 5/10 333/238 |
| 7,397,328 | B2 * | 7/2008 | Yasuda | H01P 5/10 333/204 |
| 7,825,746 | B2 * | 11/2010 | Yeung | H03H 7/38 333/185 |
| 8,228,154 | B2 * | 7/2012 | Liu | H01F 17/0013 29/602.1 |
| 2002/0175002 | A1 | 11/2002 | Sakakura et al. | |

FOREIGN PATENT DOCUMENTS

| | | | | | |
|---|---|---|---|---|---|
| CN | WO 2016033890 | A1 | * | 3/2016 | H01P 1/20345 |
| CN | 104241737 | A | * | 12/2016 | H01P 5/10 |
| JP | 2000236227 | A | | 8/2000 | |

* cited by examiner

LTCC BALUN FILTER USING TWO OUT-OF-PHASE FILTERING CIRCUITS

CROSS-REFERENCE TO RELATED APPLICATIONS

The present application is a national phase entry under 35 U.S.C. §371 of International Application No. PCT/CN2014/092999 filed Dec. 4, 2014, which claims priority from Chinese Application No. 201410446156.2 filed Sep. 3, 2014, all of which are hereby incorporated herein by reference.

TECHNICAL FIELD

The invention presents a balun filter which could be applied to RF front-end circuits. The designed balun filter is composed of two out-of-phase filtering circuits.

BACKGROUND

The upgrade of modern communication systems makes the rapid development of the RF frond-end circuits. Thus the RF components should meet more requirements, such as high performance, small dimensions and low cost.

A balun is an essential component for the conversion between the balanced signals and unbalanced signals in many RF circuits, such as balanced mixers and amplifiers. In many applications, a filter is connected with the balun for signal selection, which increases the cost, size and complexity of the communication system. Thus, it is very necessary to integrate a balun and a filter in a single circuit. In recent years, lots of methods have been proposed to design balun filters. Firstly, a simple method is to integrate the balun and filter by using the internal matching circuit. However, the circuit topology is complicated and the circuit is bulky. Another method to implement the balun function is based on the bandpass filter which employs the unbalance characteristics between the input and output ports. The topology is relatively simple. However, it only can be achieved by using some specifical filter structures. Thus, this is not a common method. Besides, some symmetrical four-port networks can also be utilized to achieve the balun filter. In this invention, the balun filter using the coupled resonators is based on the phase characteristics of the resonator. The two filtering networks composed of half-wavelength resonators have balanced amplitude and unbalanced phased characteristic, which makes 180° phase difference at the two open ends. Thus, the balun filter is designed according to the theory.

In order to design the balun filter, various techniques have been employed, such as waveguides, cavities, and printed circuit boards. Although the good performance can be obtained, the complicated circuit structures lead to bulky size of the RF components, which is not suitable for practical applications.

SUMMARY OF THE INVENTION

In order to overcome the design contradictions between the minimization and complex structures of the RF devices, this invention presents a LTCC balun filter using two out-of-phase filtering circuits. The low temperature co-fired ceramic (LTCC) technology is employed, which reduces the circuit size greatly. A balun filter based on the multi-layer structure of LTCC technology not only guarantees the small size and the light weight, but also features of low cost, good high-frequency performance and low insertion loss comparing to the conventional microstrip balun filter.

The objectives of the present invention are achieved by the following technical solutions:

A LTCC balun filter composed of two out-of-phase filtering circuits, is implemented on the multi-layer LTCC technology. This technology consists of thirteen dielectric substrate layers, fourteen metal layers and thirteen vias. The thirteen dielectric substrate layers are all LTCC ceramic which are laminated sequentially from the bottom to the top; the fourteen metal layers are printed on the surface of dielectric substrates using LTCC printing process; the thickness of the dielectric substrate between the first metal layer and the second metal layer is in the range of 0.05 mm to 0.15 mm, the thickness of the dielectric substrate between the second metal layer 2 and the third metal layer is in the range of 0.15 mm to 0.25 mm, the thickness of the dielectric substrate between the third metal layer and the fourth metal layer is in the range of 0.05 mm to 0.15 mm, the thickness of the dielectric substrate between the fourth metal layer and the fifth metal layer is in the range of 0.05 mm to 0.15 mm, the thickness of the dielectric substrate between the fifth metal layer and the sixth metal layer is in the range of 0.15 mm to 0.25 mm, the thickness of the dielectric substrate between the sixth metal layer and the seventh metal layer is in the range of 0.05 mm to 0.15 mm, the thickness of two dielectric substrates between the seventh metal layer and the eighth metal layer is in the range of 0.15 mm to 0.25 mm, the thickness of the dielectric substrate between the eighth metal layer and the ninth metal layer is in the range of 0.05 mm to 0.15 mm, the thickness of the dielectric substrate between the ninth metal layer and the tenth metal layer is in the range of 0.05 mm to 0.15 mm, the thickness of the dielectric substrate between the tenth metal layer and the eleventh metal layer is in the range of 0.15 mm to 0.25 mm, the thickness of the dielectric substrate between the eleventh metal layer and the twelfth metal layer is in the range of 0.05 mm to 0.15 mm, the thickness of the dielectric substrate between the twelfth metal layer and the thirteenth metal layer is in the range of 0.15 mm to 0.25 mm, and the thickness of the dielectric substrate between the thirteenth metal layer and the fourteenth metal layer is in the range of 0.05 mm to 0.15 mm.

The out-of-phase LTCC balun filter are composed of three half-wavelength resonators which are located on the second, the third, the fifth, the sixth, the eighth, the ninth, the tenth, the twelfth and the thirteenth metal layers. The first strip line is on the second metal layer, with two terminals named as terminal 4 and terminal 5. Two other center symmetric strip lines, the second strip line and the third strip line, compose the metal layer 3. Terminal 7 and terminal 8 are added at the two terminals of the second strip line, while terminal 9 and terminal 10 are attached to the third strip line. The fourth strip line is on the fifth metal layer, with two terminals named as terminal 11 and terminal 12. Two other center symmetric strip lines, the fifth strip line and the sixth strip line, compose the metal layer 6. Terminal 13 and terminal 14 are added at the two terminals of the fifth strip line, while terminal 15 and terminal 16 are attached to the sixth strip line. Two other center symmetric strip lines, the seventh strip line and the eighth strip line, compose the eighth metal layer. Terminal 17 and terminal 18 are added at the two terminals of the seventh strip line, while terminal 19 and terminal 20 are attached to the eighth strip line. Two other center symmetric strip lines, the ninth strip line and the tenth strip line, compose the ninth metal layer. Terminal 21 and terminal 22 are added at the two terminals of the ninth strip line, while terminal 23 and terminal 24 are attached to the tenth strip line. Two other center symmetric strip lines, the eleventh strip line and the twelfth strip line, compose the tenth metal layer. Terminal 25 and terminal 26 are added at the two terminals of the eleventh strip line, while terminal 27 and terminal 28 are attached to the twelfth strip line. Two other center symmetric strip lines, the thirteenth strip line and the fourteenth strip line, compose the twelfth metal layer. Terminal 29 and terminal 30 are added at the two terminals of the thirteenth strip line, while terminal 31 and terminal 32 are attached to the fourteenth strip line. The fifteenth strip line is on the thirteenth metal layer, with two terminals named as terminal 33 and terminal 34. There are two separate striplines in the first and the sixth metal layers, with two terminals named as terminal 35 and terminal 36; the first half-wavelength resonator consists of the fifth, sixth, and ninth metal layers; the second half-wavelength resonator consists of the second, third and eighth metal layers; the third half-wavelength resonator consists of the tenth, twelfth, and thirteenth metal layers; the first half-wavelength resonator is coupled with the second and third half-wavelength resonators, respectively, which form two out-of-phase filtering networks.

In the above out-of-phase LTCC balun filter, Port 2 is on the sixth metal layer which is extended from the position near terminal 4 of the first strip line. Port 3 is near the terminal 34 of the fifteenth strip line. These two ports are used as output ports in this invention. Port 1 is located on the fourth strip line on the fifth metal layer which is used as an input port in the present invention.

In the above LTCC balun filter using two out-of-phase filtering circuits, the first, fourth, seventh, eleventh and fourteenth metal layers are used as the ground of the three half-wavelength resonators; the first metal layer is used as the first rectangular ground and the fourth metal layer is the second rectangular ground; the height between the first and second metal layers and the height between the third and fourth metal layers can be modified to control the impedance characteristics of the first, second, and third strip lines. The seventh metal layer is the third rectangular ground of the ground of the fifth metal layer, and the fourth metal layer is used as the ground of the sixth metal layer; the height between the fourth and fifth metal layers and the height between the sixth and seventh metal layers can be modified to control the impedance characteristics of the fourth, fifth and sixth strip lines. The eleventh metal layer is the fourth rectangular ground and is used with the seventh metal layer as the ground of the eighth, ninth and tenth metal layers; the height between the seventh and eleventh metal layers and the intermediate circuits thereof can be modified to control the impedance characteristics of the seventh, eighth, ninth, tenth, eleventh and twelfth strip lines, thus modifying the broadside coupling strengths between the eighth, tenth metal layers and the ninth metal layer. The metal layer 14 is the fifth rectangular ground, and used as the ground of the twelfth metal layer; the eleventh metal layer is used as the ground of the thirteenth metal layer. The height between the eleventh and twelfth metal layers and the height between the thirteenth and fourteenth metal layers can be modified to control the impedance characteristics of the thirteenth, fourteenth, and fifteenth strip lines. The fourth metal layer is the second ground; there are three holes in the second rectangular ground, namely, the first hole, the second hole and the third hole; besides, three slots, namely, the first slot, the second slot and the third slot, are designed at the sides of the second rectangular ground; there are four holes, namely, the fourth hole, the fifth hole, the sixth hole and the seventh hole, in the third rectangular ground; the fourth slot and the fifth slot are designed at two sides of the seventh metal layer; there are two holes, namely, the eighth hole and the ninth hole, in the fourth rectangular ground; the sixth slot, the seventh slot and the eighth slot at designed at three sides of the fourth rectangular ground.

In the above out-of-phase LTCC balun filter, thirteen vias are utilized to connect the different metal layers. Via 1 is used to connect terminal 35 and terminal 36. Via 2 connects the terminal 4 and the terminal 8; via 3 connects the terminal 5 and the terminal 9; via 4 connects the terminal 7 and the terminal 17; via 5 connects the terminal 10 and the terminal 19; via 6 connects the terminal 11 and the terminal 14; via 7 connects the terminal 12 and the terminal 15; via 8 connects the terminal 13 and the terminal 21; via 9 connects the terminal 16 and terminal 23; via 10 connects the terminal 25 and the terminal 29; via 11 connects the terminal 27 and the terminal 32; via 12 connects the terminal 30 and the terminal 33; and via 13 connects the terminal 30 and the terminal 33.

In the above LTCC balun filter using two out-of-phase filtering circuits, the three half-wavelength resonators have similar structures which consist of fourteen metal layers, the eighteen dielectric substrates layers and the thirteen vias in the whole device.

In comparison with the previous design, the present invention has the following advantages:

Compared with the traditional balun filter composed of half-wavelength resonators, the multi-layer LTCC technology is utilized in the present invention. Thus, one resonator is used as a common resonator in the two filtering networks, which reduce circuit size. Besides, owing to the multi-layer structure, the circuit which is distributed in different metal layers increases the design flexibility and reduces the circuit size further. As a result, the present invention has a compact size and the dimensions are 5.4 mm in length, 4.1 mm in width and 1.8 mm in height, respectively.

2. In the present invention, the LTCC balun filter using two out-of-phase filtering circuits makes it convenient to simulate and debug, due to the high similarities in the structures and layouts of the three resonators. The roll-off of the two outputs in the passband is very consistent in performance. The phase difference is due to the different positions of the ports. The coupling of the resonators is reduced because the resonators are separated by the ground layers; in the present invention, the asymmetric parts of a resonator can be used for fine tuning the performance, which increases the freedom of design.

DETAILED DESCRIPTION OF THE INVENTION

In order to illustrate technical solutions of the presented invention more clearly, an example design used in the present embodiments will be introduced concisely in the following part. The figures in the following descriptions are just the embodiments of the present invention. For a person of ordinary skill in the art, other drawings may be obtained based on these drawings without any creative effort.

Figure 1:
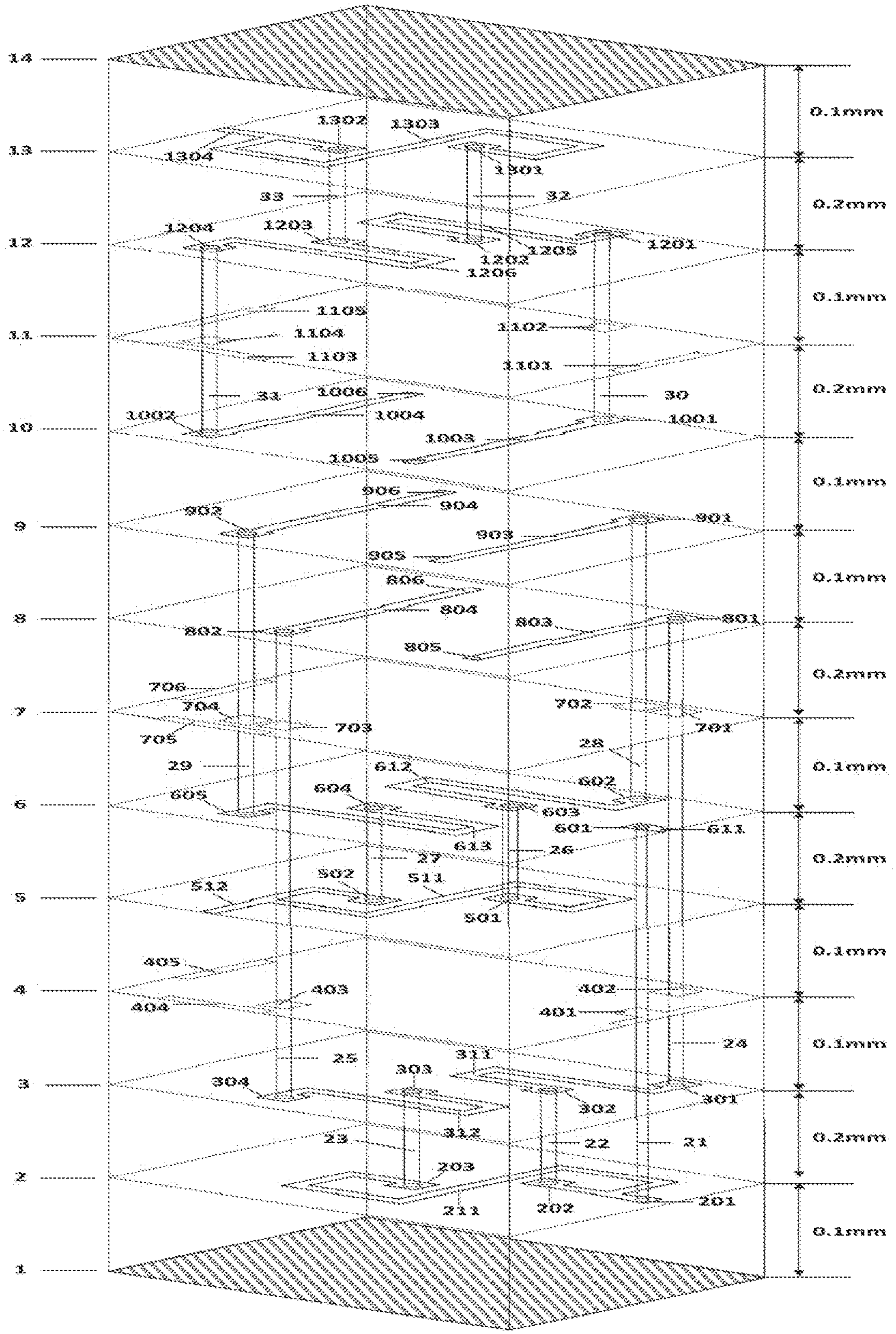
FIG. 1 is the 3-dimensional structure of the present invention.

FIG. 1 shows the structure of the present LTCC balun filter using two out-of-phase filtering circuits, which is realized based on the LTCC multi-layer structure, consisting of eighteen dielectric substrate layers, fourteen metal layers and thirteen vias. The eighteen dielectric substrate layers are all LTCC ceramic which are laminated sequentially from the bottom to the top; the fourteen metal layers are printed on the surface of dielectric substrates using LTCC printing process; the thickness of the dielectric substrate between the metal layer 1 and the metal layer 2 is 0.1 mm, the thickness of the dielectric substrate between the metal layer 2 and the metal layer 3 is 0.2 mm, the thickness of the dielectric substrate between the metal layer 3 and the metal layer 4 is 0.1 mm, the thickness of the dielectric substrate between the metal layer 4 and the metal layer 5 is 0.1 mm, the thickness of the dielectric substrate between the metal layer 5 and the metal layer 6 is 0.2 mm, the thickness of the dielectric substrate between the metal layer 6 and the metal layer 7 is 0.1 mm, the thickness of two dielectric substrates between the metal layer 7 and the metal layer 8 is 0.2 mm, the thickness of the dielectric substrate between the metal layer 8 and the metal layer 9 is 0.1 mm, the thickness of the dielectric substrate between the metal layer 9 and the metal layer 10 is 0.1 mm, the thickness of the dielectric substrate between the metal layer 10 and the metal layer 11 is 0.2 mm, the thickness of the dielectric substrate between the metal layer 11 and the metal layer 12 is 0.1 mm, the thickness of the dielectric substrate between the metal layer 12 and the metal layer 13 is 0.2 mm, and the thickness of the dielectric substrate between the metal layer 13 and the metal layer 14 is 0.1 mm.

Figure 2:
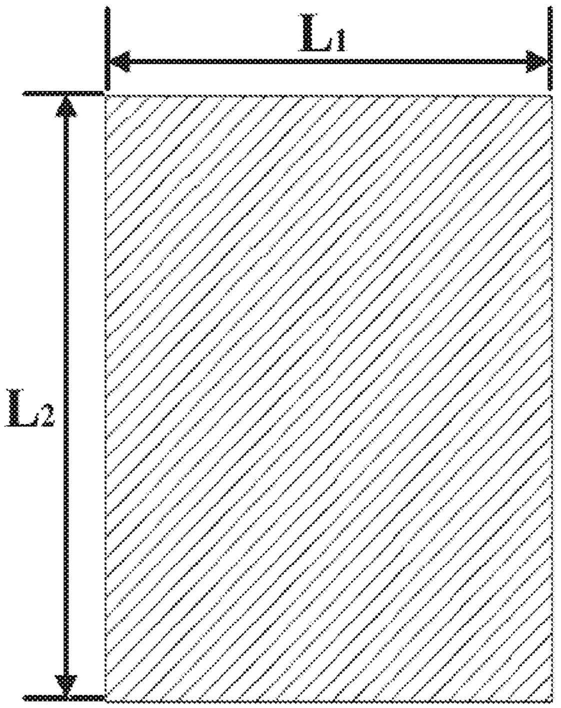
FIG. 2 is a top view of the first metal layer of the present invention.

As shown in FIGS. 1 and 2, the metal layer 1 is the first rectangular ground.

Figure 3:
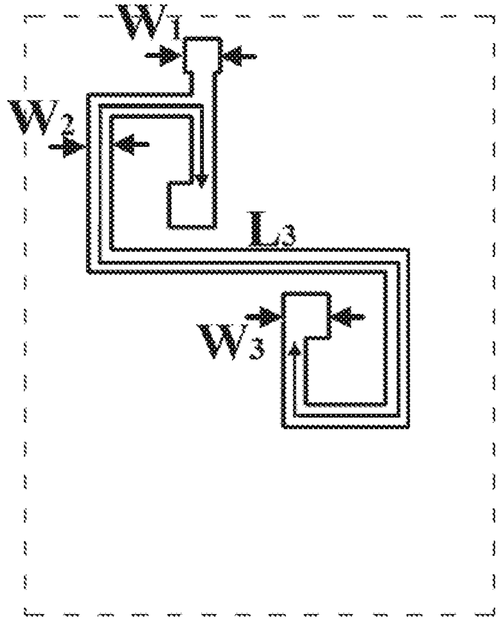
FIG. 3 is a top view of the second metal layer of the present invention.

As shown in FIGS. 1 and 3, the first strip line (L1) is on the metal layer 2, with two terminals named as terminal 4 (202) and terminal 5 (203); and a port is taped on the first stripline 211, which is near the fourth end 202.

Figure 4:
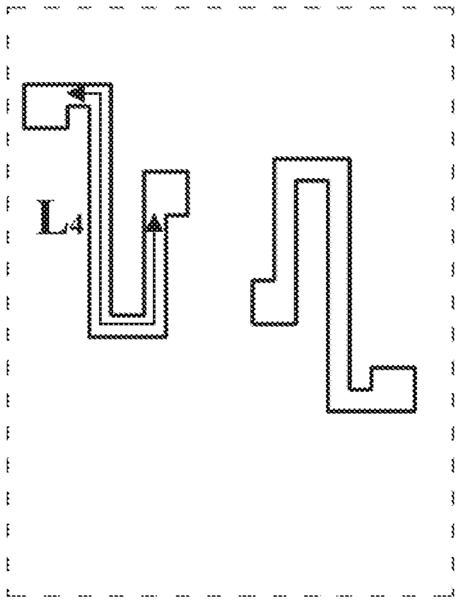
FIG. 4 is a top view of the third metal layer of the present invention.
Figure 5:
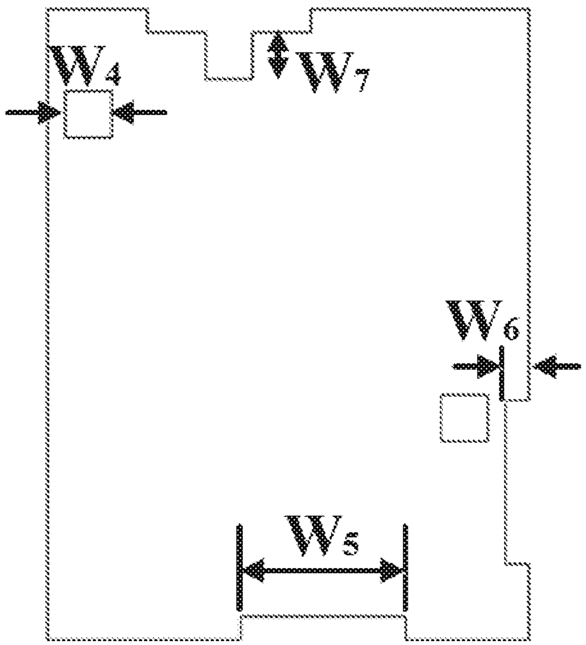
FIG. 5 is a top view of the fourth metal layer of the present invention.

As shown in FIGS. 1 and 4, the second stripline 311 with two terminals of the terminal 7 (301) and the terminal 8 (302), and the third stripline 312 with two terminals of the terminal 9 (303) and the terminal 10 (304), are bent in n-shape and center-symmetrically disposed in the third metal layer;

As shown in FIGS. 1 and 5, the metal layer 4 is the second rectangular ground, there are three holes on the metal layer 4, i.e., a first hole 401, a second hole 402 and a third hole 403; furthermore, there is a first slot 404 and a second slot 405 at the sides of the metal layer 4.

Figure 6:
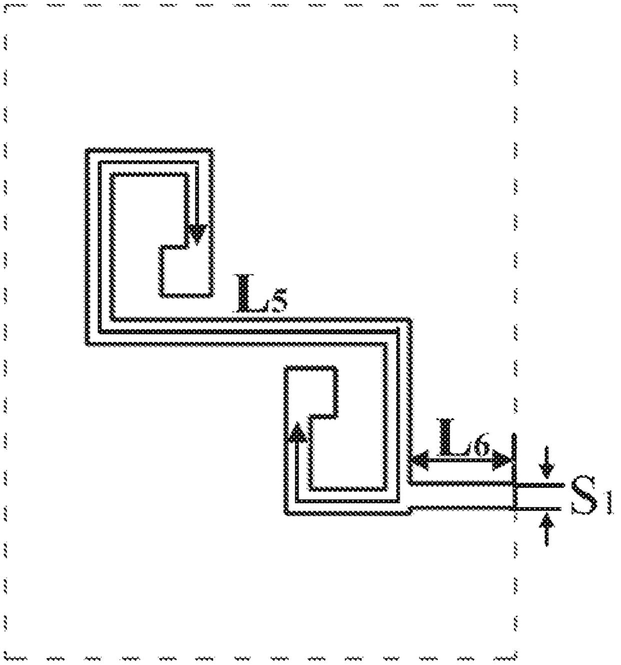
FIG. 6 is a top view of the fifth metal layer of the present invention.

As shown in FIGS. 1 and 6, the metal layer 5 consists of a fourth stripline 511, two ends of the fourth stripline 511 are the terminal 11 (501) and the terminal 12 (502), respectively.

Figure 7:
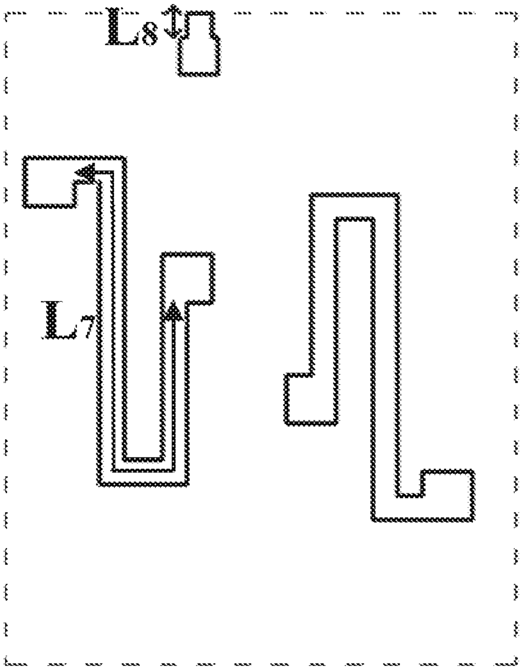
FIG. 7 is a top view of the sixth metal layer of the present invention.

As shown in FIGS. 1 and 7, the metal layer 6 consists of a fifth stripline 612 and a sixth stripline 613 which are bent in n-shape and disposed symmetrically, two ends of the fifth stripline 612 are the terminal 13 (602) and the terminal 14 (603), respectively, and two ends of the sixth stripline 613 are the terminal 15 (604) and the terminal 16 (605), respectively.

Figure 8:
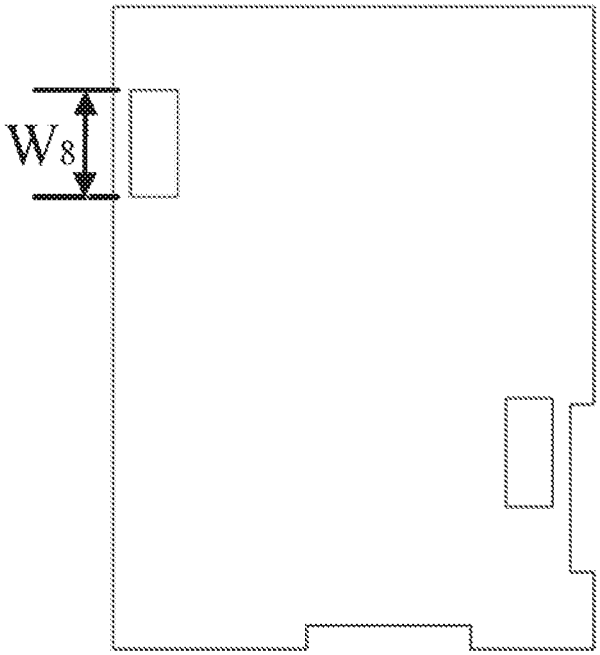
FIG. 8 is a top view of the seventh metal layer of the present invention.

As shown in FIGS. 1 and 8, the metal layer 7 is utilized as the ground on which there are four holes, i.e., a fourth hole 701, a fifth hole 702, a sixth hole 703 and a seventh hole 704; furthermore, there is a fourth slot 705 and a fifth slot 706 at two sides of the metal layer 7, respectively.

Figure 9:
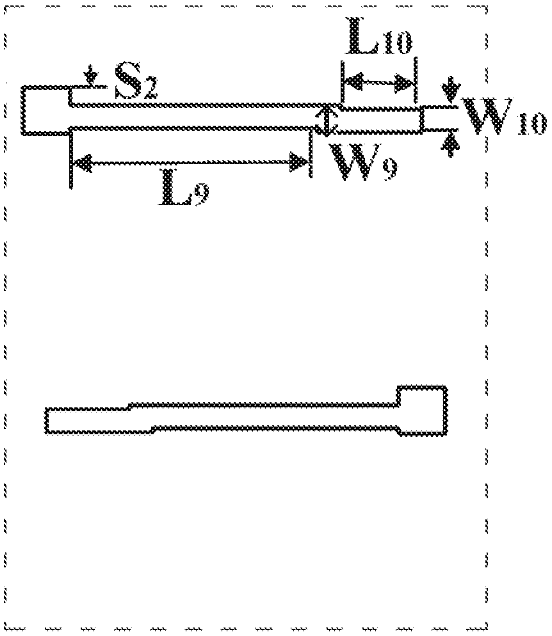
FIG. 9 is a top view of the eighth metal layer of the present invention.

As shown in FIGS. 1 and 9, the metal layer 8 consists of a seventh stripline 803 and an eighth stripline 804 which are bent in n-shape and disposed center-symmetrically, two ends of the seventh stripline 803 are the terminal 17 (801) and the terminal 18 (805), respectively, and two ends of the eighth stripline 804 are the terminal 19 (802) and the terminal 20 (806), respectively.

Figure 10:
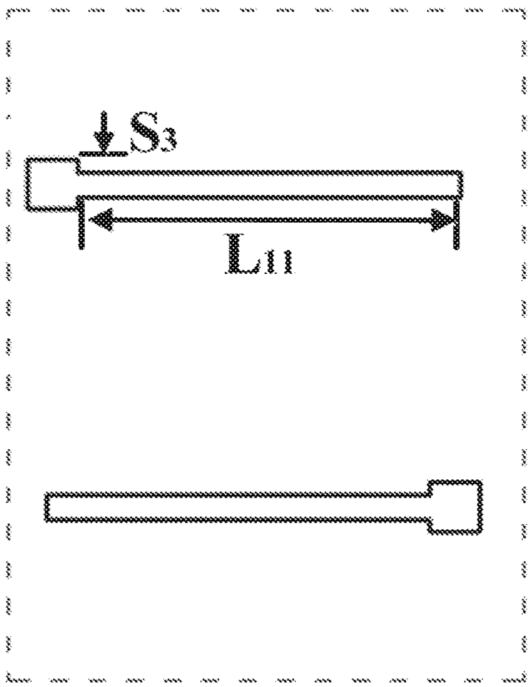
FIG. 10 is a top view of the ninth metal layer of the present invention.

As shown in FIGS. 1 and 10, the metal layer 9 consists of a ninth stripline 903 and a tenth stripline 904 which are disposed center-symmetrically, two ends of the ninth stripline 903 are the terminal 21 (901) and the terminal 22 (905), respectively, and two ends of the tenth stripline 904 are the terminal 23 (902) and the terminal 24 (906), respectively.

Figure 11:
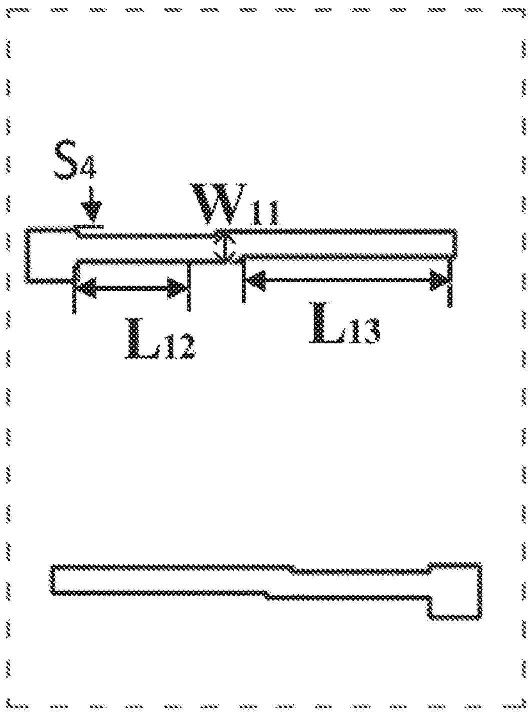
FIG. 11 is a top view of the tenth metal layer of the present invention.

As shown in FIGS. 1 and 11, the metal layer 10 consists of an eleventh stripline 1003 and a twelfth stripline 1004 which are bent and disposed center-symmetrically, two ends of the eleventh stripline 1003 are the terminal 25 (1001) and the terminal 26 (1005), respectively, and two ends of the twelfth stripline 1004 are the terminal 27 (1002) and the terminal 28 (1006), respectively.

Figure 12:
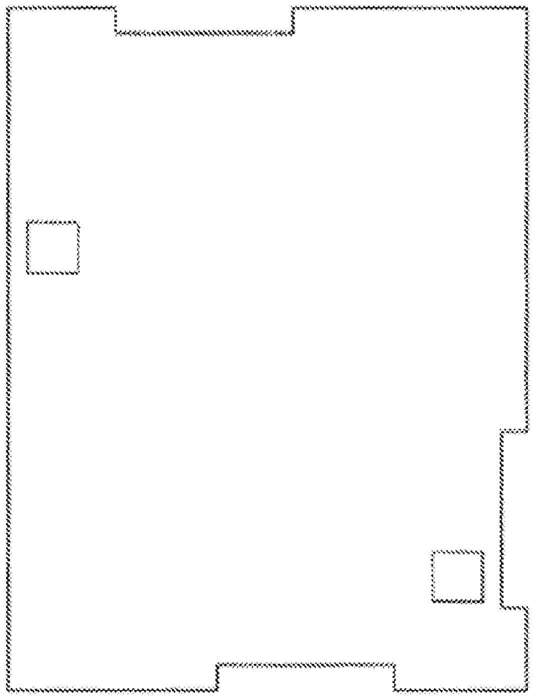
FIG. 12 is a top view of the eleventh metal layer of the present invention.

As shown in FIGS. 1 and 12, the metal layer is the fourth ground on which there are two holes, i.e., an eighth hole 1102 and a ninth hole 1104, respectively; furthermore, there is a sixth slot 1101, a seventh slot 1105 and an eighth slot 1105 at three sides of the metal layer 11, respectively.

Figure 13:
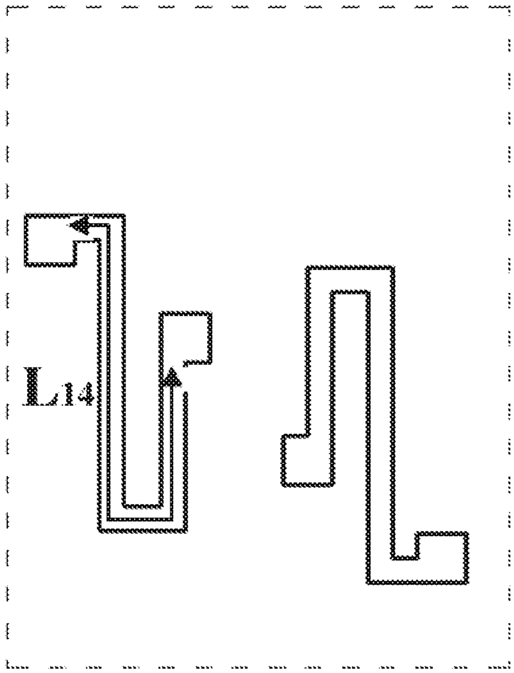
FIG. 13 is a top view of the twelfth metal layer of the present invention.

As shown in FIGS. 1 and 13, the metal layer 12 consists of a thirteenth stripline 1205 and a fourteenth stripline 1206 which are bent in n-shape and disposed symmetrically, two ends of the thirteenth stripline 1205 are the terminal 29 (1201) and the terminal 30 (1202), respectively, and two ends of the fourteenth stripline 1206 are the terminal 31 (1203) and the terminal 32 (1204), respectively.

Figure 14:
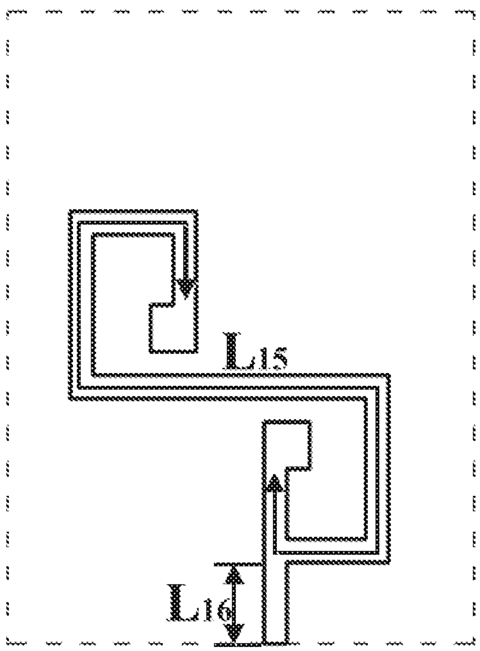
FIG. 14 is a top view of the thirteenth metal layer of the present invention.

As shown in FIGS. 1 and 14, the metal layer 13 consists of a fifteenth stripline 1303, and two ends of the fifteenth stripline 1303 are the terminal 33 (1301) and the terminal 34 (1302), respectively; there are two separate extension wires in the metal layers 1 and 6, and their ports are the terminal 35 (201) and the terminal 36 (601), respectively.

Figure 15:
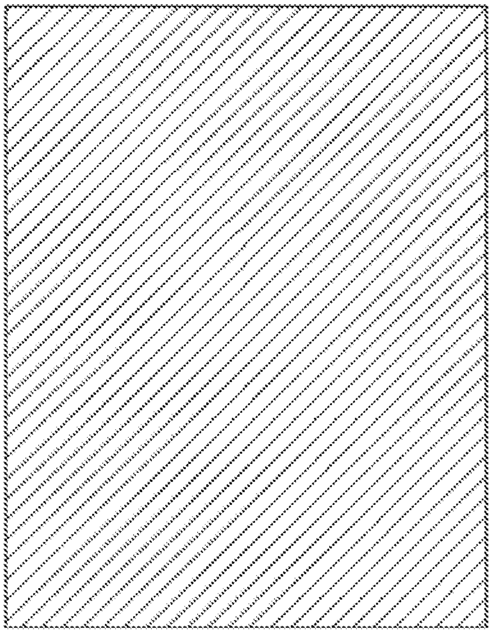
FIG. 15 is a top view of the fourteenth metal layer of the present invention.

As shown in FIGS. 1 and 15, the metal layer 14 is the fifth ground which is rectangular.

In the present embodiment, the passband center frequency is determined by the length of a half-wavelength resonator, filtering characteristics of two output ports are obtained by the filtering network formed by the half-wavelength resonator respectively, and the characteristic that the output ports' phases are out-of-phase is determined by the characteristics that half-wavelength two open ends' amplitudes are equal and their phases are opposite.

Figure 16:
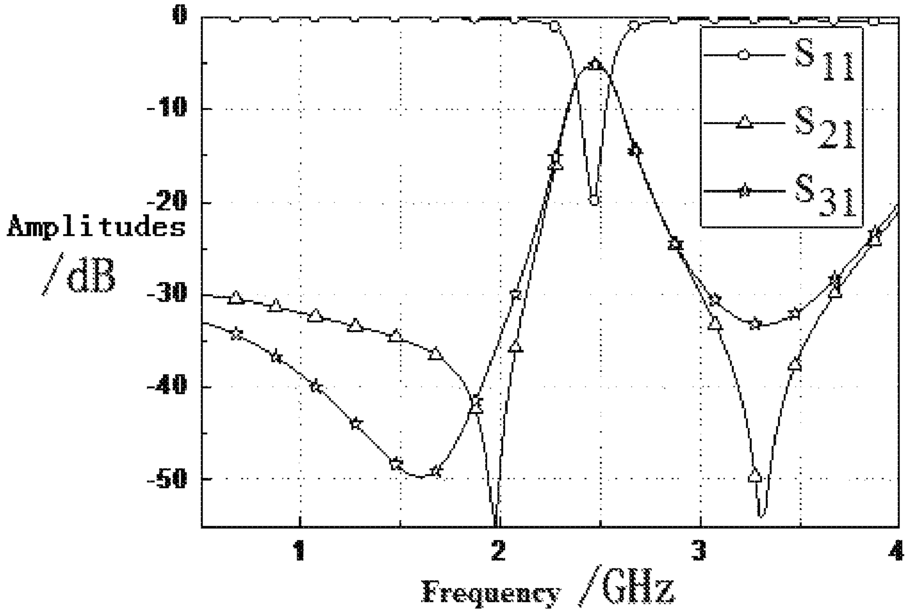
FIG. 16 and FIG. 17 are the experimental results the present invention.
Figure 17:
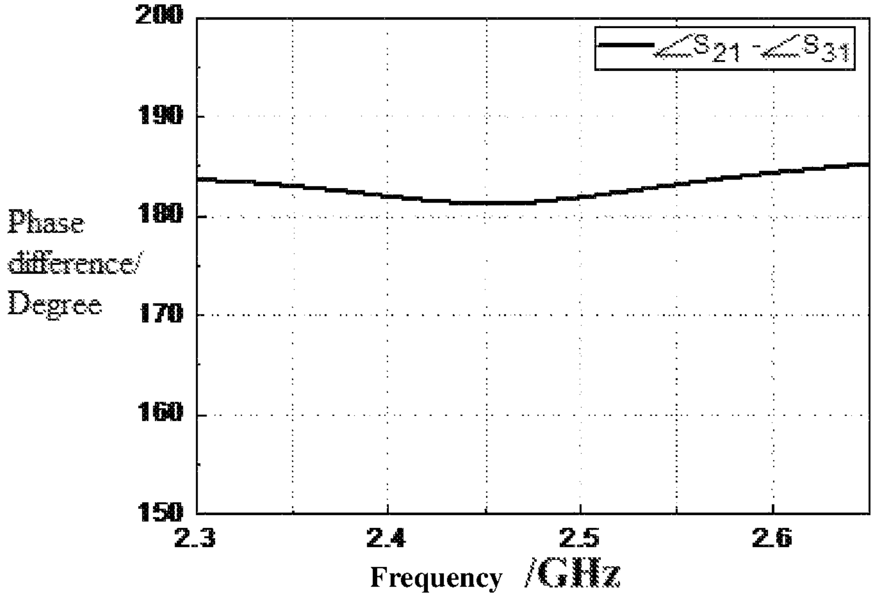

As an example, various parameters of the present embodiment are described as follows:

As shown in FIGS. 2 to—14, $L_1$ and $L_2$ are the length and width of the first ground respectively, $L_1$ is 4.1 mm, and $L_2$ is 5.4 mm; the length $L_3$ of the first stripline is 8.1 mm, the width $W_1$ by which a port connects to a pad is equal to 0.3 mm, the width $W_2$ of a stripline is 0.2 mm, the length $W_3$ of a side of a square standard pad is 0.4 mm, the length of the second stripline is equal to the length $L_3$ of the third stripline, $L_4$ is 3.84 mm; the length $W_4$ of a side of a square hole on the ground is equal to 0.4 mm, the length $W_5$ of the slot is equal to 1.4 mm, the width $W_6$ is equal to 0.2 mm, the hole connecting to a slot is equal to the length of a side of the square hole, $W_7$ is equal to $W_4$ which is 0.4 mm, the length $L_5$ of the fourth stripline is equal to 8.1 mm, the length $L_6$ of port 1 is equal to 0.8 mm, the distance $S_1$ between the port and the bottom of the stripline id equal to 0.05 mm; the lengths of the fifth stripline and the sixth stripline are equal, $L_7$ is equal to 4.6 mm; the length $L_8$ of the leading-out wire of the second port is equal to 0.2 mm, the length $W_8$ of the rectangular hole on the third ground is equal to 0.9 mm; the length $L_9$ of coupling part of the seventh stripline is equal to 1.6 mm, $L_{10}$ is equal to 1.2 mm, the width $W_9$ of the connecting wire is equal to 0.24 mm, the width $W_{10}$ of the coupling wire is equal to 0.2 mm, the distance $S_2$ between the coupling wire and the top of the pad is equal to 0.15 mm; the sizes of the eighth and the seventh striplines are the same; the sizes of the ninth and the tenth striplines are the same, $L_{11}$ is equal to 3.05 mm, the distance $S_3$ away from the top of the pad is equal to 0.1 mm; the sizes of the eleventh and the twelfth striplines are the same, the lengths $L_{12}$, $L_{13}$ of coupling parts are equal to 0.6 mm, 2.2 mm respectively, the width $W_{11}$ of the connecting wire is equal to 0.24 mm, the distance $S_4$ between the coupling wire and the top of the pad is equal to 0.05 mm; the sizes of the thirteenth and fourteenth striplines are the same, the length $L_{14}$ is equal to 4.4 mm; the length $L_{15}$ of the fifteenth stripline is equal to 8.1 mm, the length $L_{16}$ of the leading-out wire of the port 3 is equal to 0.7 mm; the widths employed by the striplines in the present embodiment are all 0.2 mm; the thickness of each layer of dielectric substrate is 0.1 mm, metallic silver is employed by the metal layers as material, the dielectric substrate is ceramic, relative dielectric constant Er is 5.9, dielectric loss tangent tan is 0.002, and the volume of the entire device is 5.4 mm*4.1 mm*1.6 mm. Measurements are as shown in FIGS. 16, 17, including four curves, $S_{11}$, $S_{21}$, $S_{31}$, and the phase difference between $S_{21}$ and $S_{31}$, the filter works at 2.45 GHz, the minimum insertion loss is 5.15 dB, return loss within passband is about 19 dB, there is a transmission zero immediately near the upper passband and another transmission zero near the lower passband in one way, and suppression levels of the passband upper side frequency and the passband lower side frequency in the other way are all below −30 dB. The phase difference between the other two outputs is about 183°, the deviation is less than 2°; thus, the filter has very excellent filtering characteristics and out-of-phase characteristics.

In summary, the present invention provides a LTCC balun filter using two out-of-phase filtering circuits. It has excellent performance of small size, low insertion loss, good filtering effect and out-of-phase characteristics. It can be processed to be chip components and is easy to integrate with other circuit modules. Thus, the proposed balun filter can be widely applied in the RF front-end of wireless communication systems.

The described design is a design example of the invention and is not intended to limit the present invention. Based on the embodiments of the present invention, other embodiments achieved by making modifications, equivalents or improvement based on the present invention fall into the scope of protection of the presented invention, in case that those of ordinary skill do not make creative effort.

What is claimed:

1. A LTCC balun filter, using two out-of-phase filtering circuits and implemented with the multi-layer LTCC technology, comprises thirteen dielectric substrate layers, fourteen metal layers and thirteen vias; the thirteen dielectric substrate layers are all LTCC ceramic which are laminated sequentially from the bottom to the top; the fourteen metal layers are printed on the surfaces of dielectric substrates using LTCC printing process: the thickness of the dielectric substrate between the first metal layer and the second metal layer is in the range of 0.05 mm to 0.15 mm, the thickness of the dielectric substrate between the second metal layer and the third metal layer is in the range of 0.15 mm to 0.25 mm, the thickness of the dielectric substrate between the third metal layer and the fourth metal layer is in the range of 0.05 mm to 0.15 mm, the thickness of the dielectric substrate between the fourth metal layer and the fifth metal layer is in the range of 0.05 mm to 0.15 mm, the thickness of the dielectric substrate between the fifth metal layer and the sixth metal layer is in the range of 0.15 mm to 0.25 mm, the thickness of the dielectric substrate between the sixth metal layer and the seventh metal layer is in the range of 0.05 mm to 0.15 mm, the thickness of two dielectric substrates between the seventh metal layer and the eighth metal layer is in the range of 0.15 mm to 0.25 mm, the thickness of the dielectric substrate between the eighth metal layer and the ninth metal layer is in the range of 0.05 mm to 0.15 mm, the thickness of the dielectric substrate between the ninth metal layer and the tenth metal layer is in the range of 0.05 mm to 0.15 mm, the thickness of the dielectric substrate between the tenth metal layer and the eleventh metal layer is in the range of 0.15 mm to 0.25 mm, the thickness of the dielectric substrate between the eleventh metal layer and the twelfth metal layer is in the range of 0.05 mm to 0.15 mm, the thickness of the dielectric substrate between the twelfth metal layer and the thirteenth metal layer is in the range of 0.15 mm to 0.25 mm, and the thickness of the dielectric substrate between the thirteenth metal layer and the fourteenth metal layer is in the range of 0.05 mm to 0.15 mm.

2. The LTCC balun filter using two out-of-phase filtering circuits according to claim 1, wherein: three half-wavelength resonators consist of the second metal layer, the third metal layer, the fifth metal layer, the sixth metal layer, the eighth metal layer, the ninth metal layer, the tenth metal layer, the twelfth metal layer and the thirteenth metal layer; the first strip line is on the second metal layer, with two terminals named as terminal 4 and terminal 5; two other center symmetric strip lines, the second strip line and the third strip line, compose the third metal layer; the terminal 7 and terminal 8 are added at the two terminals of the second strip line, while terminal 9 and terminal 10 are attached to the third strip line; the fourth strip line is on the fifth metal layer, with two terminals named as terminal 11 and terminal 12; two other center symmetric strip lines, the fifth strip line and the sixth strip line, compose the sixth metal layer; the terminal 13 and terminal 14 are added at the two terminals of the fifth strip line, while the terminal 15 and the terminal 16 are attached to the sixth strip line; two other center symmetric strip lines, the seventh strip line, compose the eighth metal layer; the terminal 17 and terminal 18 are added at the two terminals of the seventh strip line, while the terminal 19 and terminal are attached to the eighth strip line; two other center symmetric strip lines, the ninth strip line, compose the ninth metal layer; the terminal 21 and terminal 22 are added at the two terminals of the ninth strip line, while the terminal 23 and terminal 24 are attached to the tenth strip line; two other center symmetric strip lines, the eleventh strip line and the twelfth strip line, compose the tenth metal layer; the terminal 25 and terminal 26 are added at the two terminals of the eleventh strip line, while the terminal 27 and terminal 28 are attached to the twelfth strip line; two other center symmetric strip lines, the thirteenth strip line and the fourteenth strip line, compose the twelfth metal layer; the terminal 29 and terminal 30 are added at the two terminals of the thirteenth strip line, while the terminal 31 and terminal 32 are attached to the fourteenth strip line; the fifteenth strip line is on the thirteenth metal layer, with two terminals named as the terminal 33 and terminal 34; there are two separate strip lines in the first and the sixth metal layers, with two terminals named as terminal 35; the first half-wavelength resonator consists of the fifth metal layer, the sixth metal layer and the ninth metal layer; the second half-wavelength resonator consists of the second metal layer, the third metal layer and the eighth metal layer; the third half-wavelength resonator consists of the tenth metal layer, the twelfth metal layer and the thirteenth metal layer.

3. A LTCC balun filter using two out-of-phase filtering circuits according to claim 1, wherein: the second port is taped at a portion in the first strip line, which is near the terminal 4, it is extended upward to the sixth metal layer; the third port is taped at a portion in the fifteenth strip line, which is near the terminal 34; these two ports are used as output ports of the LTCC balun filter using two out-of-phase filtering circuits; the first port is taped at a portion in the fourth strip line of the fifth metal layer, which is near the terminal 12, and used as an input port of the LTCC balun filter using two out-of-phase filtering circuits.

4. A LTCC balun filter using two out-of-phase filtering circuits according to claim 1, wherein: the first metal layer, the fourth metal layer, the seventh metal layer, the eleventh metal layer, the fourteenth metal layer are used as grounds of the three half-wavelength resonators; the first metal layer is the first rectangular ground; the fourth metal layer is the second ground on which there are three holes, namely a first hole, a second hole and a third hole; there is a first slot and a second slot at the sides of the fourth metal layer; the seventh metal layer is the third ground on which there are four holes, namely a fourth hole, a fifth hole, a sixth hole and a seventh hole; there is a fourth slot and a fifth slot at two sides of the fourth metal layer; the eleventh metal layer is the fourth ground on which there are two holes, an eighth hole and a ninth hole; there is a sixth slot, a seventh slot and an eighth slot at three sides of the eleventh metal layer; and the fourteenth metal layer is the fifth rectangular ground.

5. A LTCC balun filter using two out-of-phase filtering circuits according to claim 2, wherein: connections between the metal layers are achieved by employing thirteen vias: the first via connects the terminal 35 and the terminal 36 and passes through the first hole; the second via connects the terminal 4 and the terminal 8; the third via connects the terminal 5 and the terminal 9; the fourth via connects the terminal 7 and the terminal 17 and passes through the second hole and fourth hole; the fifth via connects the terminal 10 and the terminal 19 and passes through the third hole and the sixth hole; the sixth via connects the terminal 11 and the terminal 14; the seventh via connects the terminal 12 and the terminal 15; the eighth via connects the terminal 13 and the terminal 21 and passes through the fifth hole; the ninth via connects the terminal 16 and the terminal 23 and passes through the seventh hole; the tenth via connects the twenty-fifth end and the twenty-ninth end and passes through the eighth hole; the eleventh via connects the terminal 27 and the terminal 32 and passes through the ninth hole; the twelfth via connects the terminal 30 and the terminal 33 and passes through the tenth hole; and the thirteenth via connects the terminal 30 and the terminal 33.

* * * * *